United States Patent
Rosenau et al.

(10) Patent No.: US 7,223,924 B2
(45) Date of Patent: May 29, 2007

(54) VIA PLACEMENT FOR LAYER TRANSITIONS IN FLEXIBLE CIRCUITS WITH HIGH DENSITY BALL GRID ARRAYS

(75) Inventors: Steven Rosenau, Mountain View, CA (US); Mohammed Ershad Ali, Sunnyvale, CA (US); Jonathan Simon, Castro Valley, CA (US); Brian Lemoff, Union City, CA (US); Lisa Anne Windover, San Francisco, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 373 days.

(21) Appl. No.: 10/669,982

(22) Filed: Sep. 23, 2003

(65) Prior Publication Data

US 2005/0061545 A1    Mar. 24, 2005

(51) Int. Cl.
*H01R 12/04* (2006.01)
*H05K 1/11* (2006.01)

(52) U.S. Cl. .................. 174/260; 174/262; 439/66; 439/591

(58) Field of Classification Search ............. 174/260, 174/262–266; 361/783, 794; 439/66–67, 439/91, 492–493, 591
See application file for complete search history.

(56) References Cited

U.S. PATENT DOCUMENTS

| | | | |
|---|---|---|---|
| 5,362,656 A | 11/1994 | McMahon | |
| 5,448,020 A | 9/1995 | Pendse | |
| 5,635,424 A | 6/1997 | Heim et al. | |
| 6,137,168 A * | 10/2000 | Kirkman | 257/691 |
| 6,396,712 B1 * | 5/2002 | Kuijk | 361/767 |
| 6,762,367 B2 * | 7/2004 | Audet et al. | 174/255 |
| 6,962,829 B2 * | 11/2005 | Glenn et al. | 438/33 |
| 2002/0044423 A1 * | 4/2002 | Primavera et al. | 361/704 |
| 2002/0046880 A1 * | 4/2002 | Takubo et al. | 174/261 |
| 2002/0139566 A1 * | 10/2002 | Strandberg | 174/250 |
| 2003/0164541 A1 | 9/2003 | Kheng | |

FOREIGN PATENT DOCUMENTS

JP    2001/352000    8/2002

* cited by examiner

*Primary Examiner*—Jeremy C. Norris

(57) ABSTRACT

A flexible circuit having vias disposed to minimize discontinuity in a ground plane separating opposing transmission lines. The flex circuit comprises a first transmission line coupled to a first surface, a second transmission line coupled to a second opposing surface and a ground plane separating the first transmission line and the second transmission line. The flexible circuit also includes a first type of electrical connection pads disposed on the first surface, and electrically coupled to the first transmission line. The flexible circuit also includes a second type of electrical connection pads disposed on the second surface, and electrically coupled to the second transmission line wherein the second type of electrical connection pads have a higher areal density than the first type of electrical connection pads. The flexible circuit also includes vias disposed proximate the first type of electrical connection pads and extended through the ground plane to provide for electrically coupling the first transmission line and the second transmission line, such that the vias reduce discontinuity in the ground plane and aggregate discontinuity in the flex circuit.

22 Claims, 9 Drawing Sheets

VIA PLACEMENT FOR LAYER TRANSITIONS IN FLEXIBLE CIRCUITS WITH HIGH DENSITY BALL GRID ARRAYS

TECHNICAL FIELD

The invention relates to flexible circuits and more particularly to a flexible circuit to connect an integrated circuit or other electronics module to a high density ball grid array or any other connector scheme requiring a two dimensional array of closely spaced connection pads.

BACKGROUND ART

A flexible circuit (flex circuit) is a type of electrical connection device that can be bent, twisted or wrapped to fit in extremely small spaces. Flex circuits are excellent for designs with fine line traces and high-density circuitry, and are more suited for dynamic applications and vibration conditions than are conventional printed wiring boards. Using flex circuits sometimes requires transferring an electrical signal from one side of the flex circuit to the opposing side of the flex circuit.

One solution to transition signals from one side of a flex to another side of a flex is to dispose vias proximate the location of a high areal density connector scheme, such as a ball grid array (BGA). Prior Art FIG. 1A illustrates a side view of a flex circuit 110 comprising a first surface 240 and a second opposing surface 245. Flex circuit 110 has a transmission line 202 on surface 240 and a transmission line 204 on surface 245. It is appreciated that a conventional flexible circuit can have a plurality of transmission lines on each surface. Transmission lines 202 and 204 represent one of many transmission lines on each surface of the flex circuit 110. A high areal density connector scheme 120 is disposed on surface 240 and is electrically coupled to transmission line 202. Vias 246 are conventionally disposed proximate the high areal density connector scheme 120 to provide for transitioning a signal from transmission line 204 to transmission line 202. A ground plane 206 is disposed between transmission line 202 and transmission line 204 to increase signal integrity in the flex circuit 10.

To manufacture vias 246 in the flex circuit 110, a hole is formed through the flex circuit 110, including the ground plane 206. A deleterious effect of locating vias 246 proximate the high areal density connector scheme 120 is that the ground plane 206 becomes significantly discontinuous, thus causing grounding problems in the flex circuit 11O. Grounding problems occur because a signal must travel along a transmission line a distance 216 without the benefit of a ground plane 206. Prior Art FIG. 1B illustrates a top view of a portion of a ground plane 206 that is significantly discontinuous as a result of vias 246 disposed proximate connector scheme 120. In some cases, the density of the connector scheme will result in overlapping ground relief holes, thus essentially removing the entire ground plane from the area under the BGA. In addition, placing vias proximate the BGA 120 introduces an additional element of discontinuity in the transmission path on the flex circuit 110.

In other prior art approaches, the vias are located throughout the flex circuit (i.e., not coincident connector scheme 120) to avoid the grounding problems associated with locating the vias near the high-density connector scheme. However, locating the vias throughout the flex circuit distributes electrical discontinuity throughout the entire flex circuit. Every discontinuity along a transmission line is a possible reflection, thus spreading discontinuities can possibly corrupt transmission of a signal along the entire flex circuit.

SUMMARY OF THE INVENTION

Disclosed is a flexible electrical connector in accordance with the invention that transitions a signal from a transmission line on a first surface to a transmission line on an opposing surface while avoiding degradation of signal integrity. The flexible connector includes a flexible circuit having vias disposed in locations that reduce discontinuity in a ground plane separating transmission lines. By reducing the discontinuity of the ground plane separating the transmission lines, degradation of signal integrity in the flex circuit can be avoided. Furthermore, disposing vias at a location of electrical discontinuity combines discontinuity in the flex circuit, thus further avoiding degradation of signal integrity.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the various embodiments of the invention, examples of which are illustrated in the accompanying drawings. While the invention will be described in conjunction with the various embodiments, it will be understood that they are not intended to limit the invention to these embodiments. On the contrary, the invention is intended to cover alternatives, modifications and equivalents, which may be included within the invention as defined by the appended claims.

Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 2:
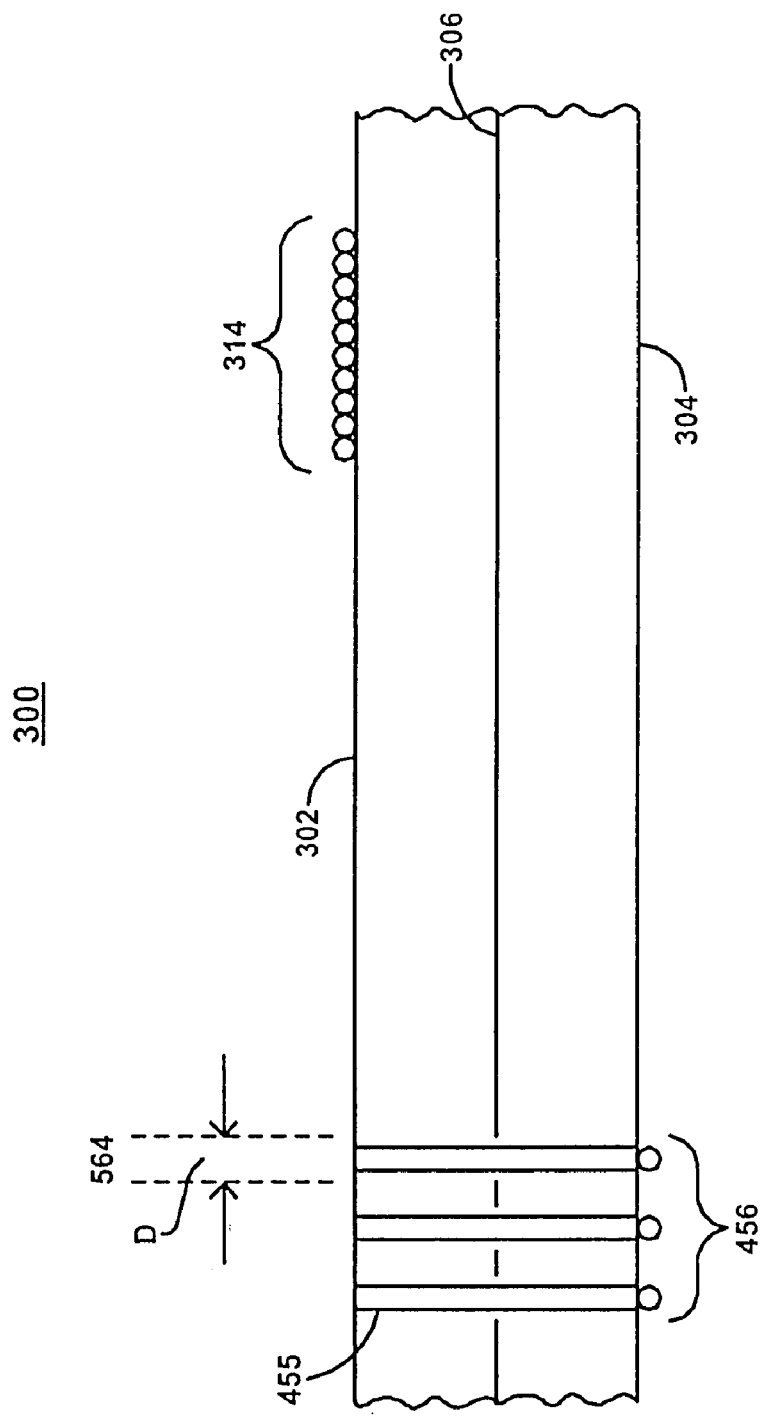
FIG. 2 is a side view illustration of an exemplary flexible circuit comprising vias located proximate a low areal density connector scheme in accordance with an embodiment of the invention.

FIG. 2 is a side-view illustration of an exemplary flexible circuit 300 having vias 455 disposed to reduce discontinuity in a ground plane 306 separating opposing transmission lines in accordance with embodiments of the invention. Flex circuit 300 has a first transmission line 302 disposed on one surface of the flexible circuit 300 and a second transmission line 304 disposed on an opposing surface of the flexible circuit 300. It is appreciated that transmission lines 302 and 304 are a few of many transmission lines on flex circuit 300. For clarity, a single transmission line is illustrated on each surface. In accordance with embodiments of the invention, flex circuit 300 has a plurality of transmission lines on each surface wherein a via electrically couples a single transmission line on one side to a single transmission line on an opposite side of flex circuit 300. A top view of flex circuit 300 is illustrated in FIG. 4B wherein a plurality of transmission lines are on a side of flex circuit 300. A ground plane 306 is disposed between transmission line 302 and transmission line 304 to improve signal integrity along the transmission lines and to isolate the transmission lines on opposite sides of the flex circuit. The flexible circuit 300 also comprises low areal density electrical connection pads 456 electrically coupled to transmission line 304. The flexible circuit also includes higher areal density electrical connection pads 314 electrically coupled to transmission line 302. In embodiments in accordance with the invention, vias 455 are disposed coincident the lower areal density electrical connection pads 456. In so doing, embodiments in accordance with the invention provide for electrically coupling transmission line 302 and transmission line 304 while reducing electrical discontinuity in flex circuit 300. Also, the lower areal density of connection pads 456 enable disposing vias for transitioning of a signal from transmission line 304 to transmission line 302 without causing significant discontinuity of ground plane 306. In addition, locating vias 455 close to an existing discontinuity on flex circuit combines the discontinuities, thus further improving signal transmission in flex circuit 300.

Figure 1A:
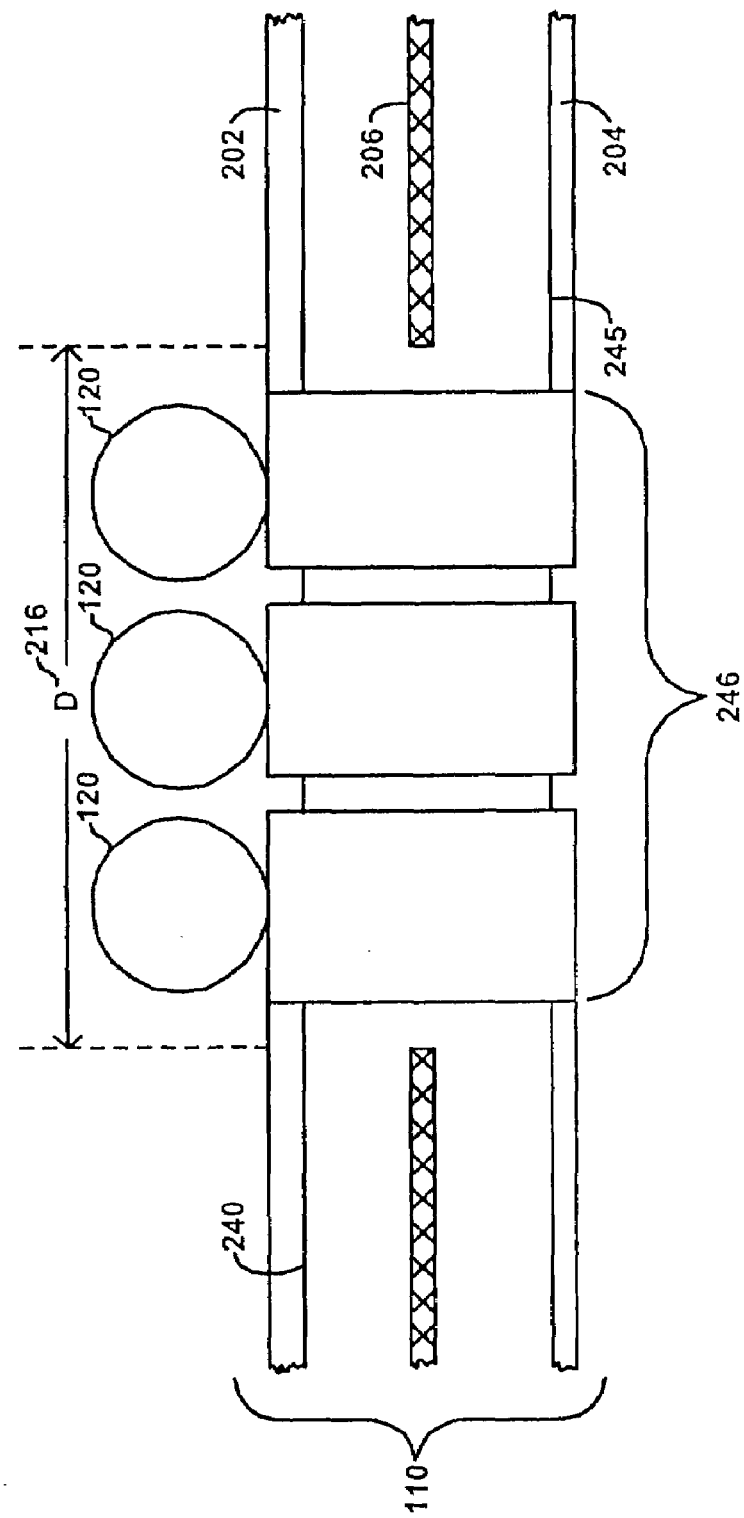
FIG. 1A is a prior art side view illustration of a conventional two-layer flex circuit comprising vias located near a high areal density connector scheme for transitioning a signal from one side to the other side.
Figure 1B:
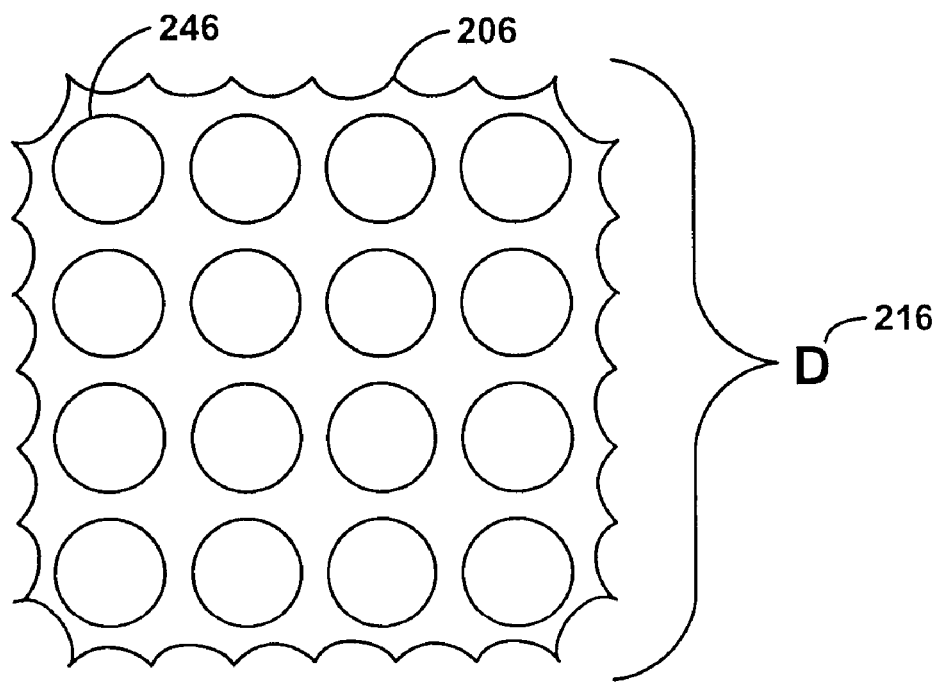
FIG. 1B is a prior art top view illustration of the ground plane in the conventional two-layer flex circuit of prior art FIG. 1A illustrating the discontinuity of the ground plane surrounding vias located near a high areal density connector scheme.

As stated above, every discontinuity along a transmission line is a possible reflection, thus possibly corrupting transmission of a signal along the line. In accordance with embodiments of the invention vias 455 are located proximate the lower areal density connection pads 456 to reduce the amount of discontinuity in ground plane 306, thus improving signal transmission in the flex circuit 300. By reducing the discontinuity of the ground plane, the distance 564 a signal must travel without the benefits of a ground plane is reduced, thus increasing signal integrity in the flex circuit 300. Furthermore, distance 564 is approximately the width of a via 455, wherein the prior art, the distance (216 from Prior Art FIGS. 1A and 1B) is multiple times the width of a via.

Figure 3:
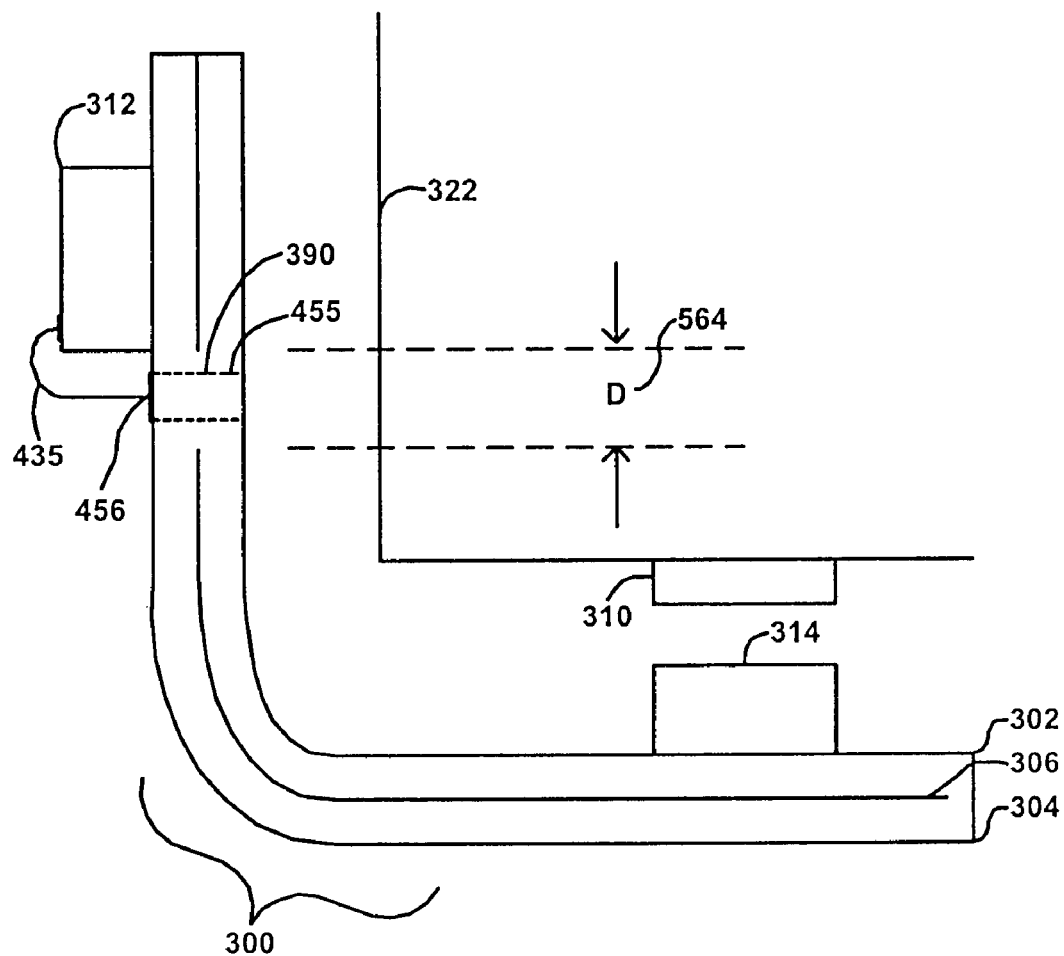
FIG. 3 is a side view illustration of an exemplary flexible circuit assembly comprising vias proximate a low areal density connector scheme connecting an IC to the exemplary flex circuit in accordance with an embodiment of the invention.

FIG. 3 is a side-view illustration of an exemplary flex circuit assembly 319 comprising exemplary flex circuit 300, an IC 312, and an external electrical sub assembly 322 in accordance with embodiments of the invention. In accordance with an embodiment of the invention, the flexible circuit (flex circuit) 300 is multi-layered wherein a ground plane 306 is disposed between transmission line 302 and transmission line 304. Ground plane 306 provides increased signal integrity along the signal transmission lines 304 and 302 as well as isolation between transmission lines on opposite sided of flex circuit 300.

An integrated circuit (IC) 312 is electrically coupled to transmission line 304 by wirebond 435 and a bond pad 456. For clarity one wirebond 435 and one bond pad 456 are illustrated. In accordance with embodiments of the invention, a plurality of wirebonds 435 and bond pads 456 electrically couple IC 312 to transmission line 304, depending on the electrical configuration of IC 312. Also, wirebond bond pads 456 are disposed in a low areal density to accommodate the geometry of the IC 312. Typically, an IC has contact pads on its periphery to allow connection to an external assembly. Furthermore, the IC 312 electrically couples to a low areal density bond pad scheme 456 and as a result, vias 455 are disposed proximate the low areal density bond pad scheme 456 without significantly degrading the ground plane 306, thus avoiding degradation of electrical integrity of the flex circuit 300. In addition, locating vias 455 proximate the low areal density bond pads 456 reduces the distance 564 a signal must travel without the benefits of a ground plane.

Moreover, wirebond 435 inherently creates an electrical discontinuity in the flex circuit assembly 319. A signal must travel the length of the wire bond from the flex circuit 300 to the IC 312 without the benefit of a ground plane. According to embodiments of the invention, combining discontinuities in a flexible circuit assembly (locating vias 455 at a location of a discontinuity) beneficially reduces the degradation of signal integrity in the flex circuit 300. More specifically, in accordance with embodiments of the invention, locating vias at a location of electrical discontinuity reduces the amount of discontinuities in the circuit assembly.

In accordance with embodiments of the invention, vias 455 are formed coincident the wirebond bond pads 456. Vias 455 can be formed by drilling, laser, etching or using any of the well-known methods in the art for forming vias. After vias 455 are formed, via plugs 390 are formed in the vias 455 to electrically couple transmission lines 304 and 302 and transfer a signal from the first side of the flex circuit to the other side of the flex circuit while avoiding degradation of signal integrity in flex circuit 300. In accordance with an embodiment of the invention, via 455 is plated on the sidewalls with a conductive material to electrically couple transmission lines on opposite sides of flex circuit 300. The via can be filled with a conductor by electroplating or any other method known in the art.

A high areal density electrical interface 314 (e.g., ball grid array (BGA), land grid array (LGA), flip chip pad array, fuzz button) is disposed on the same side of the flex circuit 300 as transmission path 302 (as shown in FIG. 3, the high density electrical interface 314 is located on the opposite side of flex circuit 300 as IC 312). In accordance with embodiments of the present invention, the electrical interface 314 is disposed with a higher areal density than connector scheme 456 used to electrically couple IC 312 to flex circuit 300.

Any of a number of well-known electrical coupling processes may be used to electrically couple the integrated circuit 312 to the conductors 456 of the flex board 300. For example, wirebonding can be employed wherein wires are bonded by thermocompression bonding, ultrasonic or wedge bonding, or by thermosonic bonding, just to name a few. In accordance with embodiments of the invention, wirebonding couples an electrical connector on IC 312 to a bond pad 456 on flex circuit 300. While the foregoing wire bonding processes are well-known in the art and are documented in numerous technical references such as, for example, Electronic Materials Handbook, Volume 1-Pack-aging, (ASM International, Materials Park, Ohio 44073, 1989), pp. 224–236, which is hereby incorporated by reference, a brief description of each process follows in the interest of providing additional background for the invention.

Thermocompression bonding is accomplished by bringing the wire and the bonding pad into intimate contact during a controlled time, temperature and pressure cycle. In one example of a thermocompression wire bonding process, a gold wire is threaded through a heated capillary on the wire bonding machine. The heated capillary is maintained at a temperature of about 350 degree C. A ball is then formed on the end of the wire by either an electronic discharge or a hydrogen flame. Surface tension causes a ball to form on the end of the wire, which is then brought in contact with the heated bonding pad. The weld is affected by applying vertical pressure to the ball and wire. The capillary is then raised and repositioned over the appropriate conductor on the flex board and the wire bonded thereto by deforming the wire with pressure from the heated capillary. A wire clamp within the wire bonding machine is then closed, and the capillary and wire raised, thereby breaking the wire at the heel of the second bond. The process is then repeated for each connection.

Ultrasonic or wedge-wedge bonding is a low-temperature process in which the source of energy for the metal welding is a transducer vibrating the bonding tool or wedge at an ultrasonic frequency, usually in the range of 20 to 60 kHz. In the ultrasonic process, the wire is threaded through a hole in the wedge and trailed under the bonding tip. The bonding tool is positioned over the first bond site with the wire protruding under and somewhat beyond the front of the wedge. The wedge is lowered and the wire is pressed tightly between the wedge and the first bond site. A burst of ultrasonic energy is then applied to the wedge which, in combination with the pressure, welds the wire to the pad. The wedge is moved over to the second bond site, lowered and ultrasonic energy is again applied to the wedge, thus bonding the wire to the second bond site. The wedge is then rocked slightly to weaken the wire at the heel of the second bond and a clamp inside the wedge is then closed and the wedge raised, separating the wire from the bond.

Referring to FIG. 3 again, an electrical sub-assembly 322 can be coupled to flex circuit 300 by electrical connectors 310 and 314. In accordance with embodiments of the invention, the electrical sub-assembly 322 comprises an electrical connector 310 configured to electrically couple to connector 314 on flex circuit 300. Furthermore, electrical sub-assembly 322 provides an electrical signal for IC 312. In addition to providing a signal to IC 312, electrical sub-assembly can serve as a heat sink for IC 312. Additionally, flex circuit 300 is configured such that IC 312 is contacting sub-assembly 322 wherein sub-assembly 322 is thermally coupled to IC 312 to provide heat sinking.

Figure 4A:
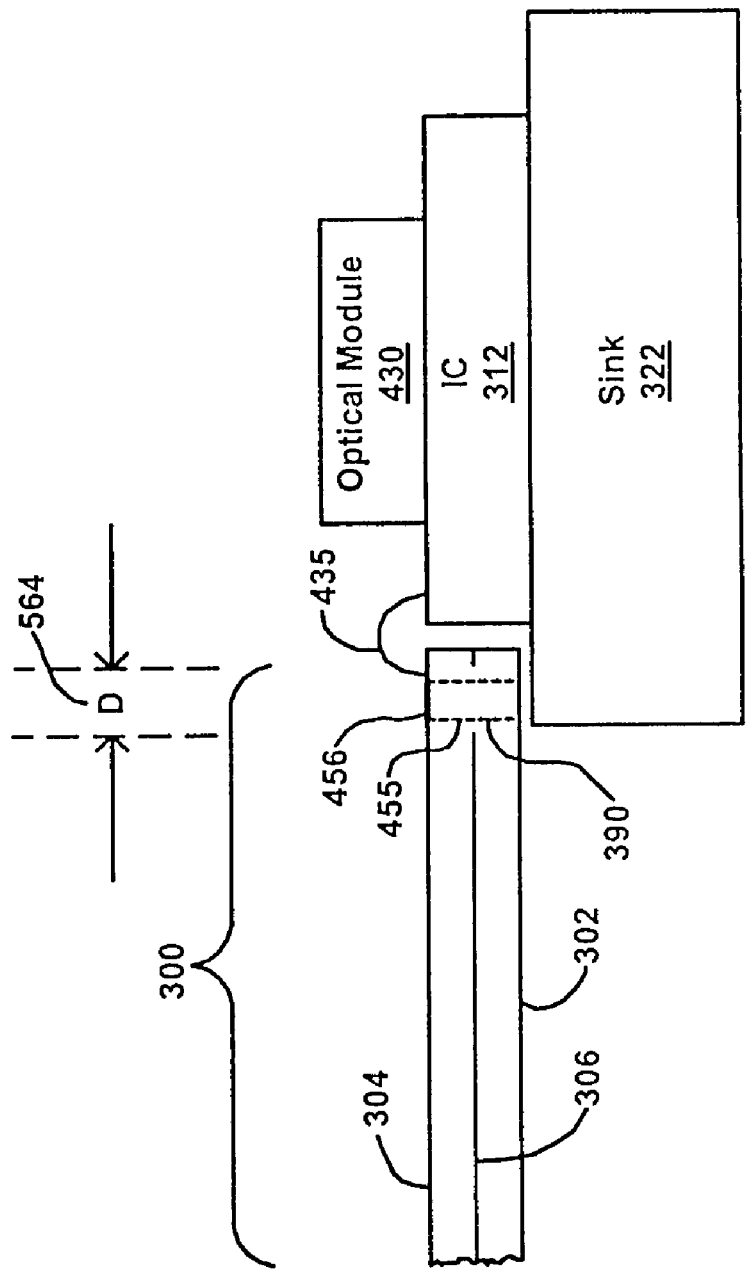
FIG. 4A is a side view illustration of the exemplary flexible circuit in FIG. 3 further comprising a heat sink in accordance with an embodiment of the invention.
Figure 4B:
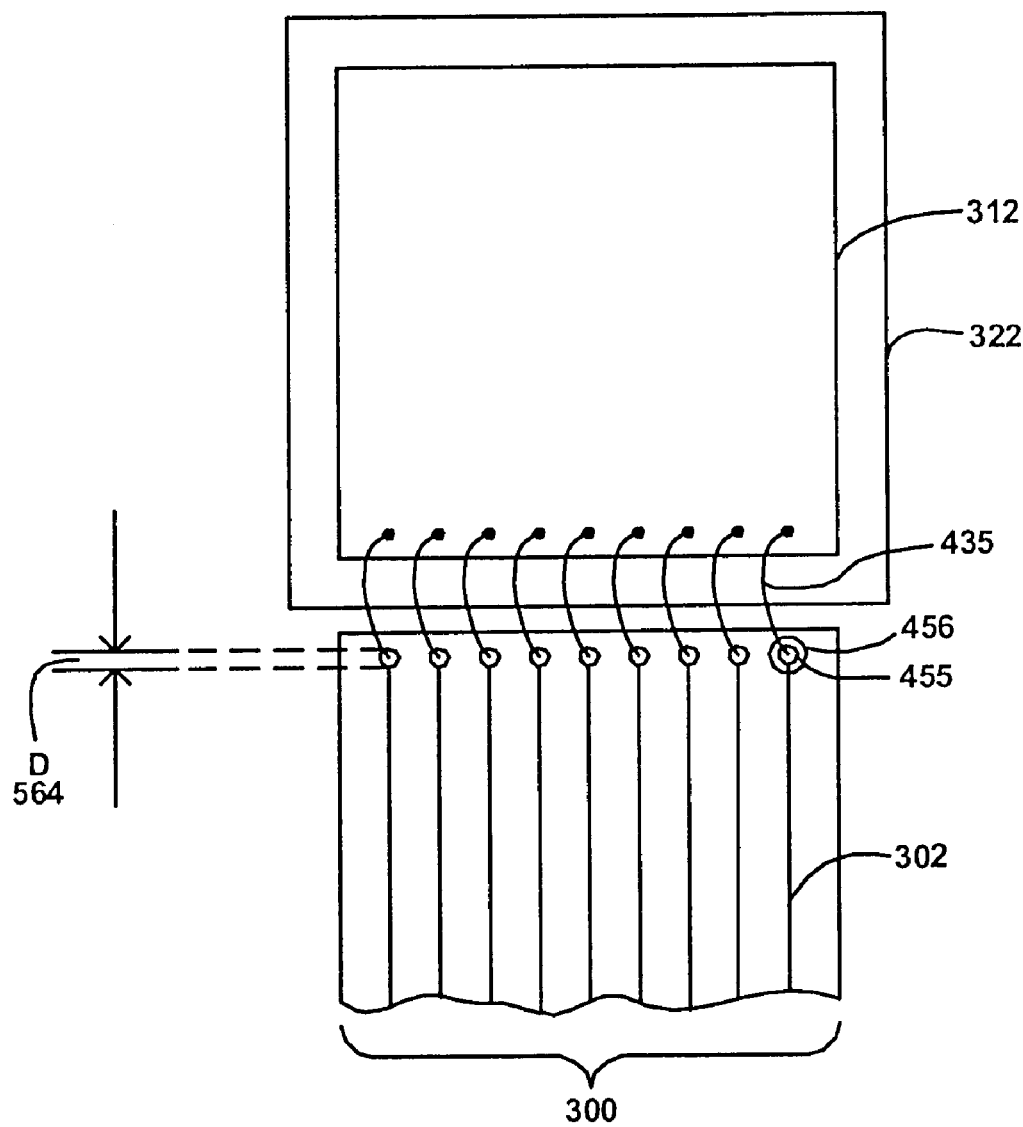
FIG. 4B is a top view illustration of an exemplary flexible circuit comprising vias proximate a low-density connector scheme to provide for transferring a signal from a first side of the circuit to a second opposing side of the flex circuit in accordance with an embodiment of the invention.

FIG. 4A is a side-view illustration of an exemplary flex circuit assembly wherein vias 455 are disposed proximate low areal density wirebond bond pads 456 to transfer a signal from transmission line 304 to transmission line 302 while reducing discontinuity in flex circuit 300 in accordance with an embodiment of the invention. As stated, flex circuit 300 comprises a first transmission line 302, a second transmission line 304, and a ground plane 306 separating transmission line 302 and transmission line 304 to reduce degradation of signal integrity. A via 455 passes through ground plane 306 which is drawn back slightly from the via and provides for forming via plug 390 to electrically couple transmission line 302 and transmission line 304. A wire bond 435 electrically couples IC 312 to bond pad 456 and via plug 390. In accordance with embodiments of the invention, electrical sub-assembly 322 is thermally coupled to IC 312 and optoelectronic device 430 is coupled to IC 312. As stated above, disposing vias at a location of discontinuity combines discontinuity in flex circuit 300, thus improving signal integrity therein. In addition, the distance 564 a signal must travel without the benefit of a ground plane proximate thereto is advantageously significantly reduced when vias 455 are disposed proximate low areal density connector pads 456.

FIG. 4B is a top view illustration of an exemplary flex circuit assembly wherein vias 455 is disposed proximate linearly arranged wirebond bond pad scheme 456 to provide for transferring a signal from a first side of a flex circuit to a second opposing side of the flex circuit while reducing discontinuities in flex circuit 300 in accordance with an embodiment of the invention. FIG. 4B is a top view illustration of the exemplary circuit assembly illustrated in FIG. 4A. FIG. 4B illustrates a wirebond bond pad scheme 456 where a wire bond 435 electrically couples IC 312 to via plug 390 (shown in FIG. 4A). Bond pad scheme 456 is arranged linearly, thus the vias 455 disposed proximate the bond pads are disposed linearly, resulting in a linear discontinuity of the ground plane. Beneficially, when vias 455 are arranged linearly, the distance 564 a signal must travel without the benefits of a ground plane therein is reduced, thus reducing degradation of signal integrity in the flex circuit. Additionally, since wirebonds 435 create an element of electrical discontinuity, advantageously, locating vias proximate wirebonds combines discontinuities in the flex circuit 300, thus reducing degradation of signal integrity therein. By locating a via at a location of discontinuity, the discontinuity of the flex circuit is combined to a location. Beneficially, the fewer discontinuities in the circuit, reduction of signal integrity degradation can be achieved. By combining the discontinuities in the flex circuit, the signal crosses fewer discontinuities.

In addition, by locating vias 455 proximate the location of the wire bond 435, the wirebond bond pad and the via capture pad can be combined into one pad 456. In accordance with embodiments of the invention, a teardrop shaped bond pad is used to combine the wirebond bond pad and the via capture pad. The method of manufacturing teardrop shaped bond pads is well known in the art.

Figure 5A:
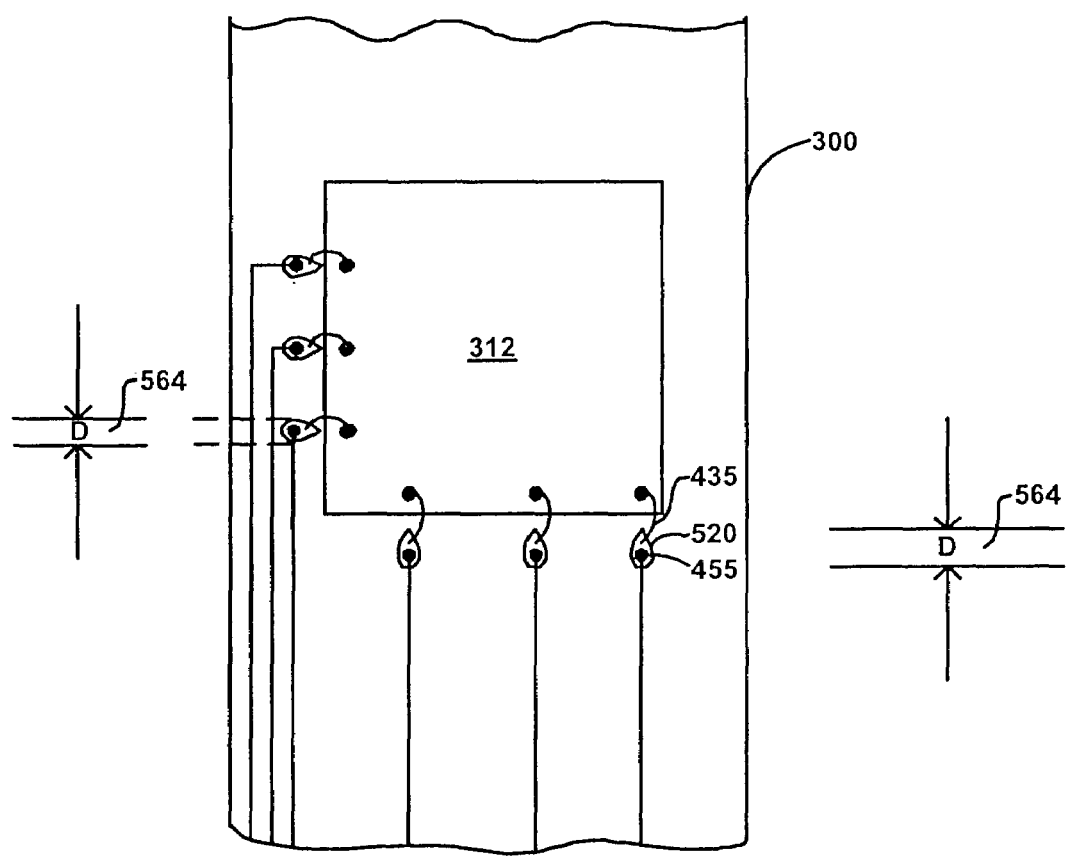
FIG. 5A is a top view illustration of an exemplary flexible circuit comprising vias disposed linearly proximate a low areal density connector scheme to minimize discontinuity in a transmission path in accordance to an embodiment of the invention.

FIG. 5A is a top view illustration of an exemplary flexible circuit assembly comprising exemplary flex circuit 300 with vias 455 disposed proximate a teardrop shaped wirebond bond pad scheme 520 to minimize electrical discontinuity and combine discontinuities in accordance with an embodiment of the invention. FIG. 5A illustrates a flex circuit 300 having larger dimensions than the IC 312, thus surrounding the IC. This configuration allows bond pads 520 to be disposed proximate the periphery of the IC 312, thus spacing the bond pads 520 and vias 455 with a lower areal density therein. In accordance with embodiments of the invention, the teardrop bond pads 520 can be staggered for closer spacing in flex circuit configurations requiring more transmission lines. In addition, the distance 564 a signal must travel without the benefit of a ground plane does not change when the teardrop bond pads 520 are staggered, because distance 564 is approximately the width of a via 455 and staggering the bonding pads 520 does not alter distance 564.

The teardrop bond pad 520 is a dual-purpose bond pad because it serves as the capture pad for via 455 and the bond pad for the wirebond 435. The footprint of the teardrop shaped bond pad 520 is smaller than if the wirebond and the via had separate pads. By sharing the same pad, higher density of the transmission lines can be achieved because the transmission lines can be spaced closer to each other. For clarity, only a few transmission lines are illustrated.

Figure 5B:
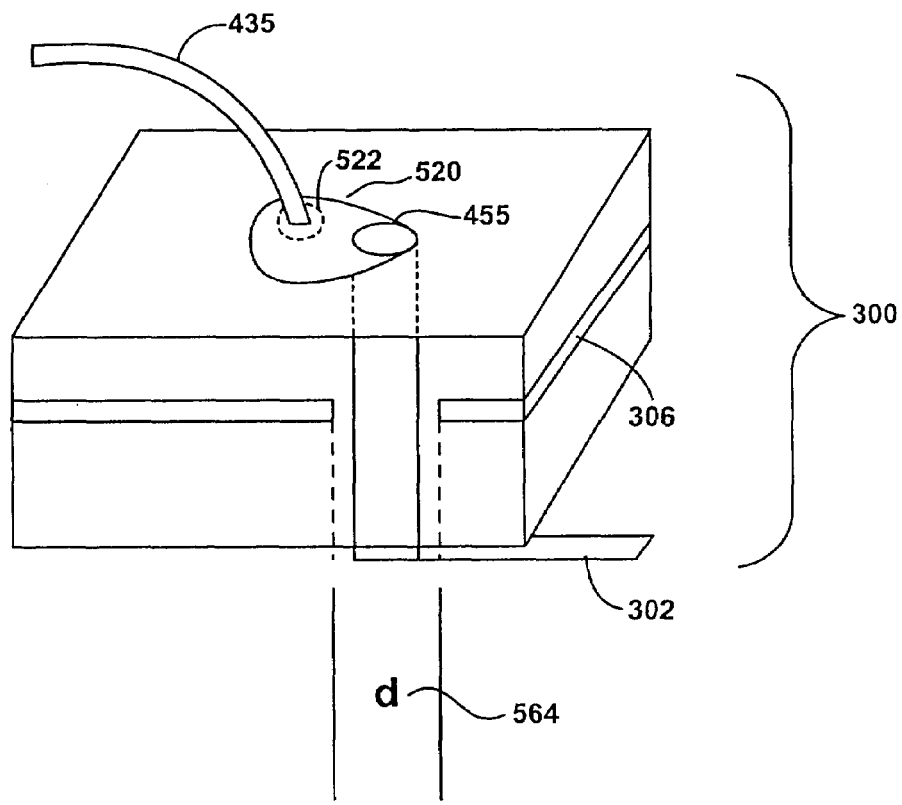
FIG. 5B is a perspective illustration of an exemplary flexible circuit having a via disposed proximate a teardrop shaped wirebond capture pad to minimize discontinuity in a ground plane in accordance with an embodiment of the invention.

FIG. 5B is a perspective illustration of a portion of a flex circuit with a via 455 disposed proximate the location of a wirebond bond pad 520 to transfer an electrical signal from one side of the flex circuit to the other side of the flex circuit while reducing discontinuity. Flex circuit 300 comprises a dual purpose teardrop pad 520 that serves as a bond pad 522 for wirebond 435 and a capture pad for via 455. As stated, a via plug (not shown for clarity) can be disposed after the via 455 is formed. A ground plane 306 is disposed between transmission line 302 and dual purpose pad 522 to increase signal integrity. As stated above, when via 455 is formed, a portion of the ground plane 306 is removed and as a result, a signal must traverse a distance 564 without the benefit of a ground plane 306 therein. The distance 564 that the signal must travel without the benefits of a ground plane is reduced when the via is disposed proximate the wirebond bond pad 520. More specifically, the amount of discontinuity in the ground plane is less when vias are disposed at a lower areal density connector scheme.

Figure 5C:
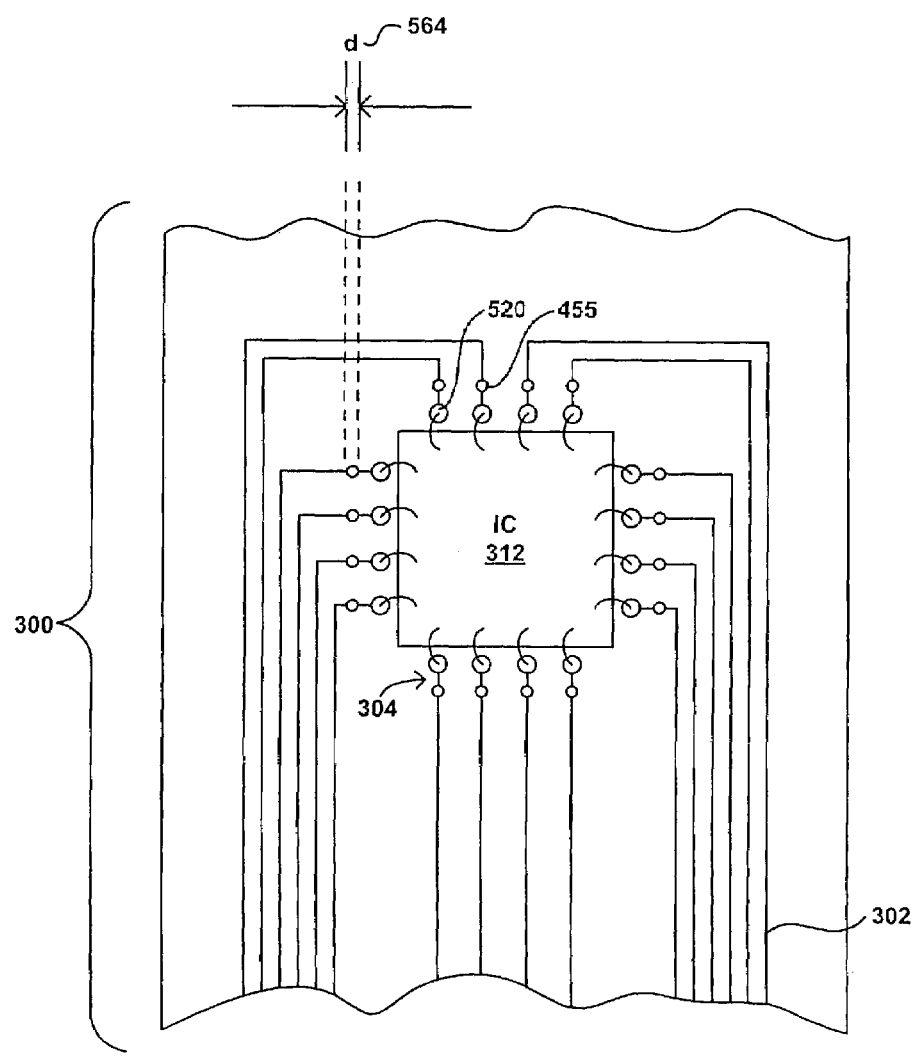
FIG. 5C is a top view illustration of an exemplary flex circuit having a minimized discontinuity in a ground plane in accordance with an embodiment of the invention.

FIG. 5C is a top view illustration of a flexible circuit 300 having reduced ground plane discontinuity as a result of vias disposed near a low areal density connector scheme such as wirebond bond pads. As described above, the distance (216 from Prior Art FIG. 2B) that a signal must travel without the benefit of a ground plane when disposing vias near a high areal density connector scheme, such as a BGA, is relatively large when compared to the smaller distance 564 when the vias are disposed proximate lower areal density wirebond capture pads. In accordance with an embodiment of the invention, vias 455 disposed proximate a low areal density connector scheme such as wirebond bond pads 520 reduce discontinuity in flex circuit 300. It is appreciated that wirebond pad 520 may also be a dual-purpose wirebond bond pad and a via capture pad (e.g., teardrop shaped pad 520 from FIG. 5B). A signal line 302 can be routed such that it must only travel a distance 564 without the benefit of a ground plane, thus improving signal integrity in flex circuit 300. Transmission line 304 resides between bond pads 520 and vias 455. When compared to the amount of discontinuity inherent in a wirebond, the additional element of discontinuity incurred by the via is negligible, therefore, combining discontinuities further improves signal integrity in flex circuit 300.

Embodiments of the present invention, a via placement for layer transitions in flexible circuits with high density ball grid arrays has been described. While the present invention has been described in particular embodiments, it should be appreciated that the present invention should not be construed as limited by such embodiments, but rather construed according to the following Claims.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A flexible circuit having vias disposed to minimize discontinuity in a ground plane separating opposing transmission lines, said flexible circuit comprising:

a first type of electrical connection pad array disposed on a first surface of said flexible circuit, wherein at least one pad of the first type of electrical connection pad array is electrically coupled to a first transmission line that lies along the first surface;

a second type of electrical connection pad array disposed on a second surface of said flexible circuit and offset from the first type of electrical connection pad array, wherein at least one pad of the second type of electrical connection pad array is electrically coupled to a second transmission line that lies along the second surface and wherein said second type of electrical connection pad array is arranged to have a higher areal density than said first type of electrical connection pads; and an intermittent ground plane arranged substantially parallel to and interposed between the first and second surfaces of said flexible circuit, said flexible circuit configured with vias that pass entirely through the flexible circuit and arranged along an axis substantially orthogonal to the first and second surfaces, the vias disposed proximate said first type of electrical connection pad array and extending through breaks in the intermittent ground plane to electrically couple said first transmission line and said second transmission line, such that said vias minimize discontinuity in said intermittent ground plane and wherein the at least one pad of the first type of electrical connection pad array is collocated with a respective via.

2. The flexible circuit as described in claim 1 wherein said first type of electrical connection pads are flip-chip pads.

3. The flexible circuit as described in claim 1 wherein said first type of electrical connection pads are wirebond bond pads.

4. The flexible circuit as described in claim 3 wherein at least one of said plurality of vias is coincident with one of said plurality of wirebond bond pads.

5. The flexible circuit as described in claim 2 wherein at least one of said plurality of vias is coincident with one of said plurality of flip-chip pads.

6. The flexible circuit as described in claim 4 wherein at least one of said plurality of wirebond bond pads is substantially tear-dropped shape.

7. The flexible circuit as described in claim 5 wherein at least one of said plurality of flip-chip pads is substantially tear-dropped shape.

8. The flexible circuit as described in claim 1 wherein said first type of electrical connection pads are configured for coupling an integrated circuit thereto.

9. The flexible circuit as described in claim 1 wherein said first type of electrical connection pads are configured for coupling an optical module thereto.

10. The flexible circuit as described in claim 1 wherein said second type of electrical connection pads are a ball grid array or pin grid array.

11. An electrical connection assembly having vias disposed to combine electrical discontinuity, said electrical connection comprising:

a flexible circuit comprising a ground plane separating a first surface and a second opposing surface, said first surface having a first transmission line and said second surface having a second transmission line; and vias that pass entirely through the flexible circuit, the vias closest to a first region of electrical connection pads configured to receive a wirebond and offset from connectors within a second region of electrical connection pads on said second opposing surface, the second region of electrical connection pads arranged to have a higher areal density than electrical connection pads in the first region of electrical connection pads, one of said vias electrically coupling said first transmission line and said second transmission line wherein said wirebond generates electrical discontinuity and said via generates electrical discontinuity and wherein said via is proximate said first region of electrical connection pads for substantially collocating said electrical discontinuity caused by said wirebond and said electrical discontinuity caused by said via, thereby minimizing discontinuity in the electrical connection assembly.

12. The electrical connection assembly as described in claim 11 wherein said first region of electrical connection pads comprises at least one via capture pad.

13. The electrical connection assembly as described in claim 12 wherein said via capture pad is substantially teardrop shaped.

14. The electrical connection assembly as described in claim 11 wherein the second region of electrical connection pads comprises a ball grid array or pin grid array.

15. The electrical connection assembly as described in claim 11 wherein said first region of electrical connection pads are configured for coupling an optical module thereto.

16. The electrical connection assembly as described in claim 14 wherein said first region of electrical connection pads has an areal density less than said second region of electrical connection pads.

17. The electrical connection assembly as described in claim 16 wherein said first region of electrical connection pads are a linear array of pads.

18. A circuit assembly having vias disposed proximate a plurality of bond pads to minimize electrical discontinuity in said circuit assembly, said circuit assembly comprising:

a flexible circuit comprising a first surface and a second opposing surface separated by a ground plane, said first surface having a first conductive layer and said second surface having a second conductive layer;

said plurality of bond pads coupled to said first conductive layer and configured to receive a wirebond electrical connection, said bond pads offset from connectors on said second surface;

electrical connection pads coupled to said second conductive layer configured to electrically couple an external electrical assembly to said second conductive layer; and vias that pass entirely through the flexible circuit, the vias collocated with said plurality of bond pads configured to receive a wirebond and offset from connectors on said second opposing surface, said vias enabling electrical coupling of said first conductive layer and said second conductive layer, said vias disposed to minimize discontinuity in said circuit assembly, wherein said plurality of bond pads are disposed with an areal density less than said connection pads.

19. The circuit assembly as described in claim 18 wherein said plurality of bond pads are via capture pads.

20. The circuit assembly as described in claim 18 wherein said plurality of bond pads are configured for coupling an optoelectronic device thereto.

21. The circuit assembly as described in claim 18 wherein at least one of said vias shares one of said plurality of bond pads.

22. The circuit assembly as described in claim 21 wherein at least one of said plurality of bond pads is substantially tear dropped shaped.

* * * * *